United States Patent [19]

Kao et al.

[11] Patent Number: 5,329,165
[45] Date of Patent: Jul. 12, 1994

[54] SELECTIVELY SWITCHABLE SUPERCONDUCTING ELECTROMAGNETIC SHIELD

[75] Inventors: Yi-Han Kao, Williamsville, N.Y.; Kai W. Wong, Lawrence, Kans.

[73] Assignee: Midwest Superconductivity, Inc., Lawrence, Kans.

[21] Appl. No.: 887,859

[22] Filed: May 26, 1992

[51] Int. Cl.$^5$ .............................................. H01F 7/00
[52] U.S. Cl. .................................... 307/91; 307/104; 335/216
[58] Field of Search .................... 361/19, 139, 141; 307/89, 91, 104, 245; 335/216; 336/DIG. 1

[56] References Cited

U.S. PATENT DOCUMENTS

| | | | |
|---|---|---|---|
| 4,612,505 | 9/1986 | Zijlstra | 324/818 |
| 5,128,643 | 7/1992 | Newman | 335/301 |
| 5,237,300 | 8/1993 | Ige et al. | 335/299 |

FOREIGN PATENT DOCUMENTS

| | | |
|---|---|---|
| 2-25008 | 1/1990 | Japan. |
| 4-99298 | 3/1992 | Japan. |
| 4-105307 | 4/1992 | Japan. |

OTHER PUBLICATIONS

Polak, et al.; Magnetic Field Dependence of Shielding Current Density in Y-Ba-Cu-O Rings at 77K; Journal of Superconductivity, vol. 2, No. 2, 1989, 210-232.
Wang, et al.; Relaxation of Magnetic Shielding Tubes of Sintered YbCo; IEEE Transactions on Magnetics, vol. 27, No. 2, Mar. 1991, 1029-1031.
Hurben et al.; Characteristics of YBaCuO Magnetic Shields; IEEE Transactions on Magnetics, vol. 27, No. 2, Mar. 1991, 1874-1876.
Yahara, et al., Magnetic Shielding Effect on Oxide Superconducting Plates; IEEE Transactions On Magnetics, vol. 25, No. 2, Mar. 1989, 2498-2501.
Okada, et al.; Applicability of Oxide Superconductor to Magnetic Shielding; IEEE Transactions on Magnetics, vol. 25, No. 2, Mar. 1989, 2270-2272.
Willis, et al.; Magnetic Shielding by Superconducting Y-Ba-Cu-O Hollow Cylinders; IEEE Transactions on Magnetics, vol. 25, No. 2, Mar. 1988, 2502-2505.
Purpura, et al.; The Fabrication and Characterization of High Temperature Superconducting Magnetic Shields; IEEE Transactions on Magnetics, vol. 25, No. 2, Mar. 1989, 2506-2510.
Symko, et al.; Magnetic Shielding and Relaxation Characteristics of Superconducting $YBa_2Cu_3O_7$ Tubes; J. Appl. Phys., 65(5), Mar. 1, 1989, 2142-2144.

Primary Examiner—Jeffrey A. Gaffin
Attorney, Agent, or Firm—Hovey, Williams, Timmons & Collins

[57] ABSTRACT

A selectively controllable, direction-, amplitude- and/or frequency-specific superconducting shield (10) is provided which includes a multiply-connected superconducting shield (12) adapted to shield a zone (13) from external magnetic, electric and/or electromagnetic fields and signals. Controlled gating of the shield (12) is provided by means (16) serving to selectively lower the critical shielding current density of a portion (26) of the shield (12) to a level permitting entrance of external fields through the portion (26), while leaving the critical shielding current densities of other portions of the shield (12) at higher, field-shielding levels. The means (16) preferably includes respective, selectively energizable coil pairs ($CP_1$, $CP_2$ ... $CP_n$) disposed about the shield (12). A highly sensitive magnetic detector (30) would include the shielding device (10) as well as a SQUID assembly (18) situated within the zone (13) defined by shield (12). The detectors of the invention may be used in passive, gating-controlled arrays in order to improve signal discrimination and signal-to-noise characteristics of conventional arrays.

25 Claims, 2 Drawing Sheets

SELECTIVELY SWITCHABLE SUPERCONDUCTING ELECTROMAGNETIC SHIELD

BACKGROUND OF THE INVENTION

1. Field of the Invention

The present invention is broadly concerned with a method and apparatus for the selectively controlled switching or gating of superconducting shields used in conjunction with magnetometers or other field detectors in order to permit selective detection of the location of the source, frequency and/or amplitude of a desired field (either magnetic, electric or electromagnetic). More particularly, it is concerned with controllable shields in the form of multiply-connected bodies of superconducting material wherein selective switching is accomplished by localized lowering of the critical shielding current density of a portion of a shield body, while maintaining the critical shielding current densities of other portions of the bodies at higher, field-shielding levels; preferably, localized critical shielding current density lowering is accomplished by application of direct current adjacent the shields, which induces corresponding local bias magnetic fields serving to suppress the current density. Shields in accordance with the invention find application in biomedical magnetic detectors, SQUID arrays used for detection of magnetic anomalies, and for direction-specific reception of electromagnetic signals.

2. Description of the Prior Art

Superconducting materials exhibit unique physical properties which are useful for effectively shielding (i.e., preventing penetration of) external magnetic, electric and electromagnetic fields. The characteristic shielding property of superconductors arises as a function of an inherent but measurable parameter of the superconductor, which can be termed the "critical shielding current density." In order to understand the shielding phenomenon, consider that when a superconducting material is sufficiently cooled below its critical temperature ($T_c$), it is essentially diamagnetic. Therefore an external field acting on the cooled superconductor creates within the structure of the superconductor an induced current, and a corresponding counter or canceling field which prevents passage of the external field through the superconductor. As the magnitude of the external field acting on the superconductor is increased, the induced current level within the superconductor also increases to generate an increasing counter field. At the same time, the critical shielding current density concomitantly decreases, until the latter is reduced essentially to zero. At this point, the superconductor can no longer generate additional induced current and counter field, and the external field will penetrate the superconductor shield. The existence and extent of the shielding phenomenon is therefore dependent upon the critical shielding current density of the superconductor employed.

The critical shielding current density and thus the overall shielding capability of a given superconductor under varying ambient conditions depends on a number of factors: (1) the critical temperature ($T_c$) of the superconductor and its dependence on external magnetic fields; (2) the distribution of magnetic field lines inside the superconductor; (3) the intragrain and intergrain critical current densities ($J_c$) and their dependence on external magnetic fields and temperature; (4) the pinning potential for magnetic fluxoids and the amount of trapped fluxoids in the superconductor; and (5) the connectivity of superconducting grains and the capability of carrying a macroscopic closed-loop supercurrent in the bulk material to screen out and shield external fields.

It has been suggested in the past to employ superconducting shields in various applications, and particularly in conjunction with high sensitivity magnetometers such as SQUIDS (superconducting quantum interference devices). In general, these prior devices include a SQUID assembly made up of a SQUID and an associated flux transformer having a superconductive shield disposed about the SQUID assembly but leaving an open, non-shielded detection window oriented for passage of the desired field towards the central detector. The goal is therefore to shield the SQUID assembly from undesired ambient fields, while permitting entry of the desired field through the detection opening. Such magnetometers have heretofore found application in non-invasive biomedical devices designed to detect the low magnitude magnetic fields emanating from body organs such as the heart, skeletal muscles, brain, lungs and eyes. They may also be used for airborne geological surveys, or in arrays for the passive detection of magnetic anomalies. A persistent problem with such devices stems from the fact that they are very sensitive, and therefore have difficulty in discriminating desired fields arising from the phenomenon under investigation, and undesired background fields. Thus, the signal-to-noise ratio of these detectors is relatively small. By the same token, these units have difficulty in determining the precise location, frequency and magnitude of a field source.

SUMMARY OF THE INVENTION

The present invention overcomes the problems outlined above, and provides superconducting shielding apparatus which can be selectively controlled or gated in order to permit entry of external fields through individual portions of the field, while the remainder of the shield maintains its normal shielding capability. As a consequence, the invention permits greatly improved direction-, amplitude- and/or frequency-specific detection of magnetic, electric and/or electromagnetic fields and signals, with enhanced signal-to-noise performance.

Broadly speaking, the shielding apparatus of the invention includes a multiply-connected body formed of superconducting material having characteristic critical temperature and critical shielding current density values. This body is disposed about a zone to be shielded and which would normally contain one or more detectors with the body being operable when cooled to a temperature below the critical temperature thereof to shield the protected zone from undesired external fields. Means is also provided for selectively lowering the critical shielding current density of a portion of the shield body to a level permitting entrance of external fields through the gated portion, while leaving another portion of the body at a higher, field-shielding level.

In preferred forms, critical shielding current densities are controlled and selectively lowered by provision of structure for generating localized applied magnetic fields adjacent the shield body. These localized applied fields are of course different from the field under detection and background noise fields, and are specifically controlled in order to lower the critical shielding current density of the selected portion of the superconducting shield to the field entrance level. Typically, the localized applied fields are generated by means of appropriately sized and located coils of non-superconducting, electrical current conducting wire, the latter being coupled to a suitable power source. In order to facilitate field detection, the coils are normally arranged in opposed pairs, with the coils of each pair being simultaneously energized.

DETAILED DESCRIPTION OF THE PREFERRED EMBODIMENT

Figure 2:
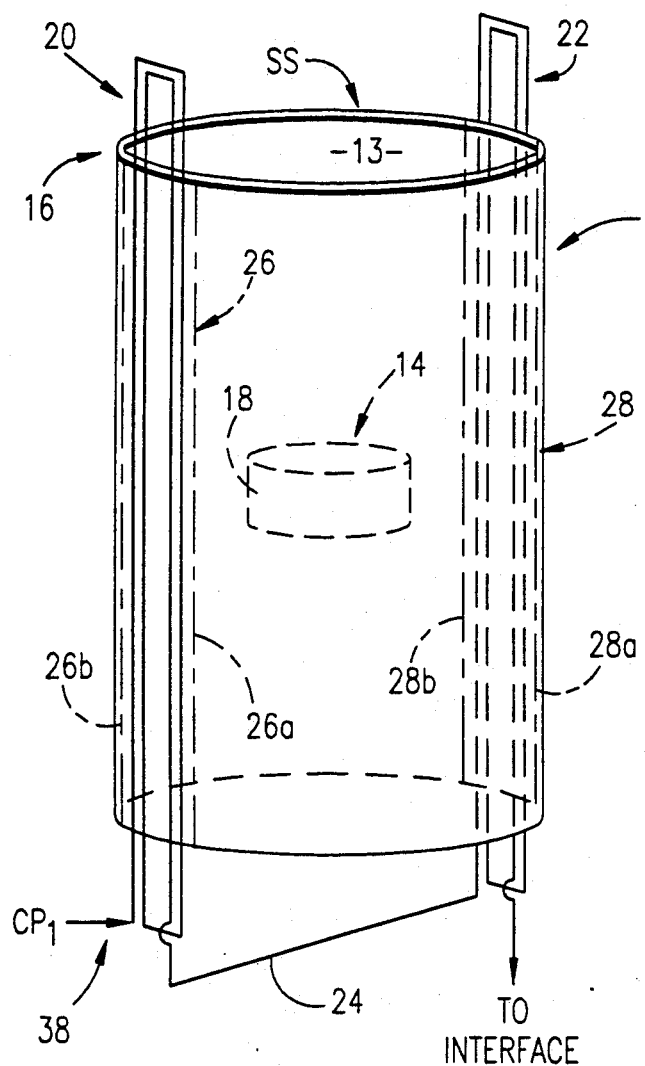
FIG. 2 is a schematic view of a SQUID-type magnetometer in accordance with the present invention, wherein a SQUID is situated within a tubular superconducting shield, the latter having a pair of opposed, selectively energizable coils adjacent the outer surface thereof for controlled switching of the shield.

Turning now to the drawings, and particularly FIG. 2, a selectively switchable, shielded field detecting device 10 is illustrated. Broadly speaking, the device 10 includes a multiply-connected superconducting shield (SS) 12 formed of a desired superconducting material and defining an interior zone 13, a detector 14 situated within the zone 13, and means broadly referred to by the numeral 16 for selectively lowering the critical shielding current density of a localized portion of the shield 12 to a level permitting entrance of external fields therethrough, while maintaining the critical shielding current density of other portions of the body at higher, field-shielding levels.

In more detail, the shield 12 is formed of superconducting material which is operable when cooled to a temperature below the characteristic critical temperature of the material to shield the detector 14 from external magnetic, electric and electromagnetic fields and signals. Any given superconducting material may be used in the invention, so long as it has characteristic and appropriate critical temperature and critical shielding current density values. Exemplary prior superconductors which may be used include the well-known YBCO oxides. The thickness of the shield 12 must be greater than its London penetration depth, and in general may range from about 0.1-2 mm.

One preferred class of superconducting materials for use as the shields hereof are the (V, Pb)-doped BSCCO compounds of the type described in U.S. Pat. No. 5,098,868 which is incorporated by reference herein. Compounds of the formula $Bi_{2-x-y}V_xPb_ySr_2Ca_2Cu_3O_z$ are advantageous because inclusion of vanadium renders the material more ductile and thus better suited for construction of shields of various geometries. Furthermore, the 2223-phase content (having $T_c$ of about 110 K) can be higher than 95% by weight of the total oxide, and hence the material can consist essentially of this single phase. Its onset and zero-resistance temperatures can be as high as 118 K and 108 K, respectively. A more important property of these compounds is that a much wider range of Pb content can be employed without significantly degrading superconducting properties. This is in sharp contrast to exclusively Pb-doped BSCCO oxides in which the Pb content has to be strictly controlled in order to maintain a high purity of the high-$T_c$ 2223-phase. These requirements conventionally limit the geometric shape which can be effectively produced, but the (V, Pb)-doped compounds overcome this difficulty.

Other useful superconductors include those described in the pending application for U.S. Letters Patent, entitled "Superconductors Having Continuous Ceramic and Noble Metal Matrices." This application was filed on Apr. 8, 1992, as Ser. No. 07/865,074, in the name of Kai Wai Wong, et al., and is incorporated by reference herein. The superconductors described in this application preferably include a superconducting matrix made up of crystalline grains selected from the group consisting of the 112, 214, 123, 2201, 1212, 1223, 2212 and 2223 families of superconducting oxides, together with a matrix of elemental noble metal such as gold, silver and palladium.

Finally, use can also be made of thallium-containing superconductors such as Tl:Ba:Ca:Cu:O 2223 oxides of the type described in application for U.S. Letters Patent Ser. No. 07/791,892, filed Nov. 13, 1991, now abandoned and incorporated by reference herein.

In preferred forms, the shield 12 is elongated and generally annular in cross-section to present a tubular, open-ended configuration. This shape is advantageous in that the qualitative shielding properties of the geometry are known, and it is relatively easy to fabricate. However, other shapes are useful, such as spherical or close-ended tubular designs.

Figure 1:
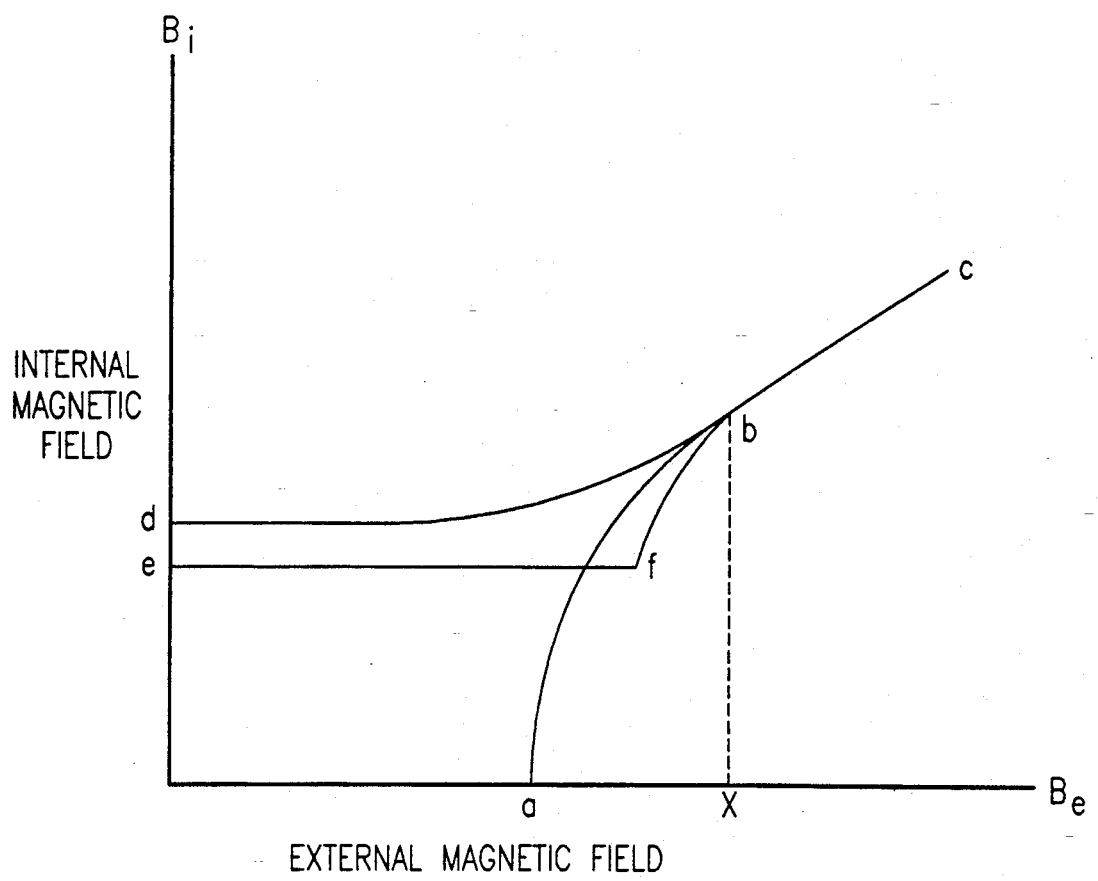
FIG. 1 is a qualitative graphical representation illustrating the shielding characteristics of a tubular superconducting body under the influence of an external magnetic field.

Attention is next directed to FIG. 1 which describes in a qualitative way the shielding properties of a superconducting shield 12 of tubular design. In FIG. 1, an externally applied magnetic field $B_e$ is plotted along the X axis, versus the measured internal magnetic field $B_i$ at the center of the tubular shield plotted along the vertical axis. Starting from the zero external magnetic field ($B_e=0$) condition, the external magnetic field begins to penetrate into the tubular shield when the field reaches a magnitude noted by point "a", which is the maximum external field which can be completely shielded by this configuration. Its value is around 30 G for sintered YBCO shields As $B_e$ is increased beyond point "a", a non-linear increase in $B_i$ is experienced, up to the point labeled "b", which corresponds with an external field magnitude "X". If the external magnetic field is reduced to zero from a value slightly greater than point "a" and below magnitude "X", $B_i$ will descend along the curve "a-b" back to zero.

If the external magnetic field is increased between points "b" and "c", the response of $B_i$ becomes linear and corresponds to the condition that the critical shielding current density of the superconductor has been reduced to zero and the external field has fully penetrated into the superconducting grains of the shield. In this case, reduction of the external field $B_e$ to zero causes $B_i$ to descend along the curve "c-d", i.e. the internal magnetic field $B_i$ remains above zero even at zero external field. This phenomenon can be attributed to flux trapping inside the superconductor. Over time, this remnant field will decrease slightly to point "e" as a result of thermally activated flux creep, with essentially a 1 n t time-dependence. If $B_e$ is increased again to a higher value, $B_i$ remains constant up to point "f", and then increases monotonically with increasing $B_e$. Thus, the shield has a magnetic memory, and the hysteretic behavior of $B_i$ is useful in various applications of superconducting shields.

The spatial variation of B can be obtained by solving the appropriate boundary-value problem in magnetostatics. In an ideal case, the axial field $B_i$ inside the tube is proportional to exp $(-3.83 z/a)$ where Z is the distance measured from the top and a is the radius of the tube. This spatial dependence of superconducting shields has been confirmed in previous studies with a measured prefactor of around 3. The exact time dependence of the trapped field is not well defined. Depending on the field value, it could change from a spin-glass-type behavior to that of thermal activation. The shielding depends on the size of the circumferential supercurrent flowing in the superconducting tube, which in turn depends crucially on how the critical shielding current density varies with magnetic field and temperature.

For granular superconductors, such as bulk YBCO and $Bi_{2-x-y}V_xPb_ySr_2Ca_2Cu_3O_z$, the temperature and field dependence of the critical shielding current density is further complicated due to an inhomogeneous distribution of magnetic field in the intergranular regions. The critical shielding current density in low magnetic fields is mainly determined by magnetic flux penetration in the intergranular region which can be roughly described by an average of the Josephson weak-links. The presence of intergrain flux lines places a limit on the critical shielding current density in the superconductor, and thus the magnitude of the field that can be completely shielded by the superconductor. One way to enhance this maximum critical shielding current density is to reduce the intergranular spacing or to increase the coupling between the adjacent superconducting grains.

Detector 14 can be any one of a number of known magnetic, electric or electromagnetic detectors. In the embodiment shown, a schematically depicted SQUID assembly 18 is used, made up of a SQUID detector and an associated flux transformer. The SQUID assembly 18 is centrally located within the confines of shield 12, both laterally and axially. Obviously, the use of shield 12 is only useful in the context of extremely sensitive detectors such as a SQUID assembly. However, other sensitive detectors may be used, such as Rf, microwave, IR and X-ray detectors, and specifically semiconductor diode detectors, photodetectors, and bolometers.

In principle, the critical shielding current density of localized regions of shield 12 may be lowered by a number of means, such as temperature alteration. From a practical point of view, however, localized lowering of the critical shielding current density can best be effected through use of structure for generating a localized magnetic field adjacent a discrete zone or portion of the shield body. Referring again to FIG. 2, it will be noted that a pair of opposed electrical coils 20, 22 are provided, which are each located closely adjacent to the exterior surface of the shield 12 and remote from detector 14. The coils 20, 22 are each formed from non-superconducting, electrical current conducting wire (e.g., copper). A single coil could be used, but performance of the device 10 is enhanced through the use of opposed coils as shown. As explained more fully below, each of the coils 20, 22 is operably coupled with a source of direct current for selective energization thereof. The coils 20, 22 are coupled in series via lead 24, whereas the coil 20 is connected to a D.C. source through lead $CP_1$. Upon energization of the coils 20, 22, localized magnetic fields are generated which serve to correspondingly create localized induced currents within the superconductor while lowering the critical shielding current densities of the respective localized portions 26, 28 of the shield 12. The portions 26, 28 are of course defined by the configuration and orientation of the associated coils 20, 22, and the energization levels thereof; for illustrative purposes, however, these zones 26, 28 have been schematically shown in FIG. 2 between boundary lines 26a, 26b and 28a, 28b. In practice, and again referring to FIG. 1, an external magnetic field $B_e$ is generated having a magnitude somewhat above point "a", but below point "X". This serves to controllably open or "gate" the shield 12 at the localized regions 26, 28, thereby permitting entry of a desired magnetic field therethrough. At the same time, the remaining portions of shield 12, not substantially affected by the current-induced localized magnetic fields, retain sufficient critical shielding current densities so as to effectively shield detector 14 from undesired external fields. The magnetic field effect of the energizing current applied to coils 20, 22 on detector 14 can be readily subtracted so as to appropriately calibrate the detector.

Figure 3:
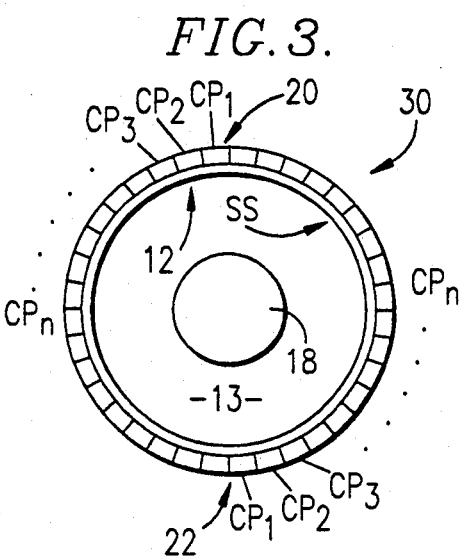
FIG. 3 is a plan view of a device similar to that illustrated in FIG. 2, but depicting the use of a plurality of selectively energizable coil pairs disposed about the outer surface of the tubular shield.
Figure 4:
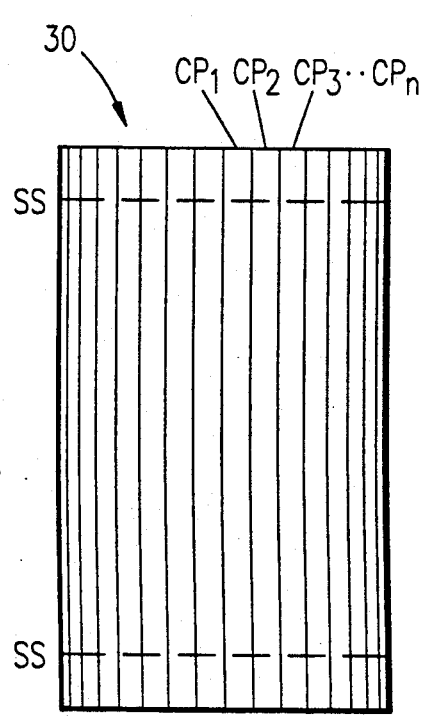
FIG. 4 is a side elevational view of the device illustrated in FIG. 3.

Attention is next directed to FIGS. 3-4 which illustrates another device 30 in accordance with the invention. In this case, the device 30 includes a tubular shield 12 as well as centrally located SQUID assembly 18. However, a plurality of selectively energizable coil pairs $CP_1$, $CP_2$ ... $CP_n$ are provided about the external surface of shield 12. As shown, the respective coil pairs are oriented so that the individual coils of each pair are in opposed relationship. Use of multiple coil pairs allow for selectively lowering the critical shielding current densities of different portions of the shield at different times to levels permitting entrance of fields to be detected into the confines of shield 12.

Figure 5:
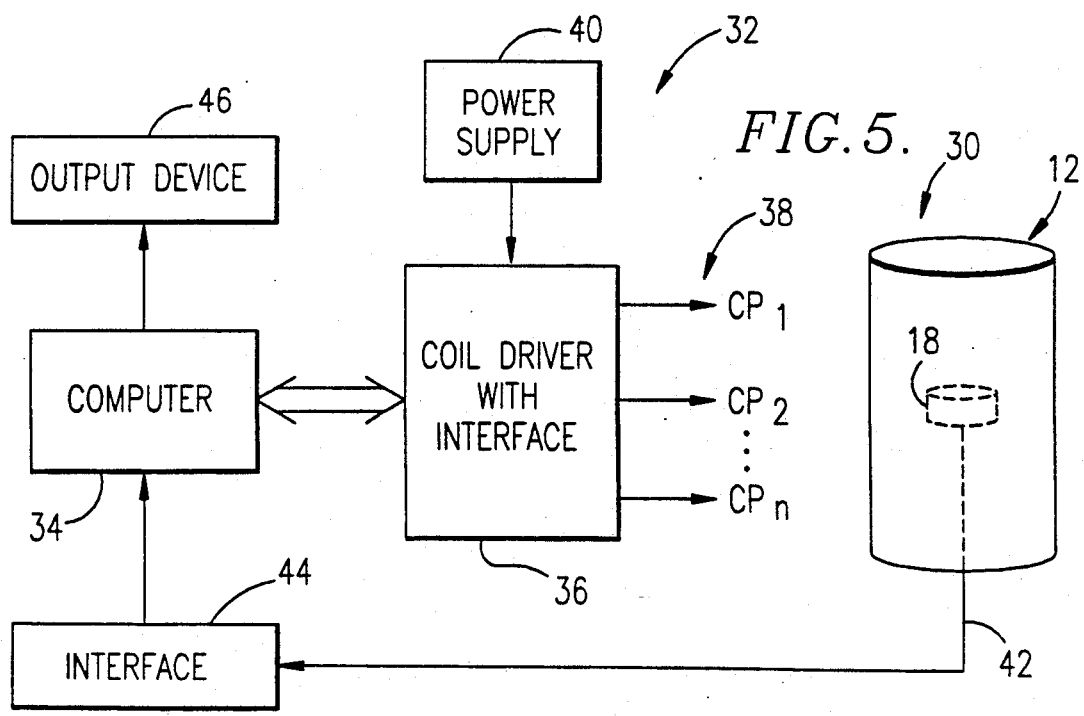
FIG. 5 is a schematic diagram illustrating representative components of a complete, selectively 20 switchable detector in accordance with the invention.

FIG. 5 schematically depicts a complete, switchable magnetic field detector 32 in accordance with the invention. The device 30 described previously, having tubular shield 12, central SQUID 18 assembly, and a plurality of selectively energizable coil pairs $CP_1$, $CP_2$ ... $CP_n$ disposed about the shield (the coil pairs are not illustrated in FIG. 5). In addition, the complete assembly would typically include a computer 34 operably coupled with a coil driver/interface 36 including output leads 38 $CP_1$, $CP_2$ ... $CP_n$ operably connected to corresponding coil pairs. The coil driver/interface 36 is in turn connected with a power supply 40 in order to provide direct current to the coil pairs through the leads 38. SQUID assembly 18 is connected via lead 42 to a conventional computer interface 44, the latter in turn being coupled with computer 34 as shown. Finally, a conventional output device 46 is likewise coupled to computer 34.

In practice, computer 34 is programmed so as to initiate and control the energization of the respective coil pairs $CP_1$, $CP_2$ ... $CP_n$ in a timed, sequential manner corresponding to the wishes of the user. It will be understood in this respect that the described system can control the coil pair energization not only on a timed basis, but also as to magnitude. As respective coil pairs are energized, the associated portions of shield 12 are switched open to permit entry of fields into the interior of shield 12. Magnetic fields can therefore be detected by SQUID assembly 18, and such detection results are conveyed to and interpreted by computer 34, the latter giving an appropriate output to device 46.

In one preferred mode of operation, the device 32 may be operated so as to maintain all of the coil pairs $CP_1$, $CP_2$ ... $CP_n$ at a level of energization creating external applied magnetic fields having a magnitude slightly below point "a" in FIG. 1. As a consequence, all of the portions of shield 12 have induced current flow therein and correspondingly lowered critical shielding current densities. When it is desired to open a specific portion of the shield 12, it is only necessary to apply an additional, relatively small magnitude "ramp up" direct current to the corresponding coil pair, thereby increasing the applied magnetic field adjacent the specific portion to a level above point "a" and below point "X" of FIG. 1. Thus, if point "a" corresponds to 30 Gauss, the coil pairs may be continuously energized at a level sufficient to generate external fields of perhaps 29 Gauss, and ramp up current may be selectively applied to individual coil pairs so as to increase the applied magnetic field adjacent a particular shield portion to perhaps 31 Gauss. This mode of operation is preferred in order to avoid field inertial problems which can arise by successive energizations of coil pairs between zero current and current levels corresponding to an applied magnetic field sufficient to open the associated shield portions.

The detection devices of the present invention have a number of outstanding advantages. For example, the devices can be used for directional-, amplitude- and/or frequency-controlled detection of fields. Considering the simple case of direction controlled detection, it will be appreciated that as a coil pair is energized sufficiently to create the field gating effect, only fields coming from a predetermined narrow direction corresponding to the opened gate can be detected; all other external, non-direction-specific fields will be excluded. This phenomenon is particularly useful in various applications of SQUID assemblies for selective, direction-specific detection of magnetic fields. A passive detector with extremely high sensitivity generally has a serious problem separating fields or signals arising from the real object to be detected, and the background. Gradiometers have been commonly used to improve selectivity, but these do not fully solve the problem. The present invention employing selective shield switching thus overcomes the longstanding discrimination problems inherent in SQUID detection, and thus enhances the usefulness of SQUID assembly detectors. For example, where plural SQUID assembly detectors are used for finding the location of underwater magnetic anomalies, simultaneous detection by three or more direction-specific SQUID assembly devices in accordance with the invention can discriminate the desired magnetic field from other disturbances or background noise (e.g., other field-generating bodies). In addition, SQUID-gradiometer detectors can be used to further enhance the selectivity of the devices, whether the object under detection is at rest or in motion. This technique improves the longstanding problem of selective signal processing using passive detection of underwater magnetic anomalies.

It will also be understood that the shield gating technique can be used for selective entry of electromagnetic (e.g., Rf) signals from a specified direction. This can be useful in the context of coded, direction-specific communications. Controlled entry of magnetic fields with a specific maximum amplitude can also be manipulated using the devices of the invention, by specific tuning of the applied magnetic fields used for shield switching. Finally, with appropriate control of the gating frequency, another degree of freedom can be added to signal processing for increased selectivity. This technique could be very useful in coded communications between dispersed active and passive detectors, and a control center.

We claim:

1. Apparatus for selectively shielding a zone from external fields comprising magnetic, electric or electromagnetic fields, said apparatus comprising:

a multiply-connected body formed of superconducting material having characteristic critical temperature and critical shielding current density values, said body being disposed about said zone and operable at a temperature below the critical temperature of the material for shielding said zone from said fields; and means for selectively lowering the critical shielding current density of a portion of said body to a level permitting entrance of external fields through said portion, while leaving the critical shielding current density of another portion of said body at a higher, field-shielding level.

2. The apparatus as set forth in claim 1, said critical shielding current density lowering means comprising structure for generating a localized magnetic field adjacent said body portion which is different than said external fields and of sufficient magnitude for lowering said critical shielding current density of said body portion to said level permitting entrance of said external fields through said body portion.

3. The apparatus as set forth in claim 2, said localized magnetic field generating structure comprising a coil of non-superconducting, electrical current conducting wire proximal to said portion and adjacent the outer surface of said body remote from said zone, and means for selectively passing direct current through said coil.

4. The apparatus as set forth in claim 3, said current passing means including means for maintaining current flow through said coil of a magnitude to generate a localized magnetic field slightly below that which will lower the critical shielding current density of said portion to said entrance level, and means for selectively passing additional current through said coil to raise the current flow through the coil to a magnitude sufficient to generate said entrance level localized magnetic field.

5. The apparatus as set forth in claim 3, said magnetic field generating structure including a pair of opposed coils each formed of non-superconducting, electrical current conducting wire and respectively located in opposed relationship and adjacent the outer surface of said body remote from said zone, said current passing means being operably connected with both of said coils.

6. The apparatus as set forth in claim 2, including means for selectively lowering the critical shielding current density of said body to said level permitting entrance of said external fields through said body portions at different times, said localized magnetic field generating structure comprising a respective coil of non-superconducting, electrical current conducting wire proximal to each individual body portion and adjacent the outer surface of said body remote from said zone, and means for selectively passing direct current through said coils.

7. The apparatus as set forth in claim 6, said localized magnetic field generating structure including respective pairs of opposed coils each formed of non-superconducting, electrical current conducting wire, with the coils of each coil pair being located in opposed relationship to each other and adjacent the outer surface of said body remote from said zone, said current passing means being operably connected with said coil pairs for selectively passing direct current through the coil pairs as desired.

8. The apparatus as set forth in claim 1, including means for selectively lowering the critical shielding current density of different portions of said body to said level permitting entrance of said external fields through said body portions at different times.

9. The apparatus as set forth in claim 1, said body being a substantially annular, elongated tube.

10. Apparatus for detecting a desired field selected from the group consisting of magnetic, electric and electromagnetic fields while discriminating other undesired fields, said apparatus comprising:
a detector for said desired field;
a multiply-connected body formed of superconducting material having characteristic critical temperature and critical shielding current density values, said body being disposed about said detector and operable at a temperature below the critical temperature of the material for shielding said detector from said desired and undesired fields; and
means for selectively lowering the critical shielding current density of a first portion of said body to a level permitting entrance of said desired field through said portion in order to permit detection of said desired field by said detector, while leaving the critical shielding current density of other portions of said body at levels substantially preventing entrance of said undesired fields therethrough.

11. The apparatus as set forth in claim 10, said detector being a magnetic field detector.

12. The apparatus as set forth in claim 11, said detector being a SQUID.

13. The apparatus as set forth in claim 10, said critical shielding current density lowering means comprising structure for generating a localized magnetic field adjacent said first body portion which is different than said desired and undesired fields and of sufficient magnitude for lowering said critical shielding current density of said first body portion to said level permitting entrance therethrough of said desired field.

14. The apparatus as set forth in claim 13, said localized magnetic field generating structure comprising a coil of non-superconducting, electrical current conducting wire proximal to said first portion and adjacent the outer surface of said body remote from said detector, and means for selectively passing direct current through said coil.

15. The apparatus as set forth in claim 14, said current passing means including means for maintaining current flow through said coil of a magnitude to generate a localized magnetic field slightly below that which will lower the critical shielding current density of said first portion to said level permitting entrance therethrough of said desired field, and means for selectively passing additional current through said coil to raise the current flow through the coil to a magnitude sufficient to generate a localized magnetic field of a level for permitting entrance of said desired field through said first portion.

16. The apparatus as set forth in claim 14, said localized magnetic field generating structure including a pair of opposed coils each formed of non-superconducting, electrical current conducting wire and respectively located in opposed relationship and adjacent the outer surface of said body remote from said detector, said current passing means being operably connected with both of said coils.

17. The apparatus as set forth in claim 10, including means for selectively lowering the critical shielding current density of different portions of said body to said level permitting entrance of said desired field at different times.

18. The apparatus as set forth in claim 17, said localized magnetic field generating structure comprising a respective coil of non-superconducting, electrical current conducting wire proximal to each individual body portion and adjacent the outer surface of said body remote from said detector, and means for selectively passing direct current through said coils.

19. The apparatus as set forth in claim 18, said localized magnetic field generating structure including respective pairs of opposed coils each formed of non-superconducting, electrical current conducting wire, with the coils of each coil pair being located in opposed relationship to each other and adjacent the outer surface of said body remote from said detector, said current passing means being operably connected with said coil pairs for selectively passing direct current through the coil pairs as desired.

20. The apparatus as set forth in claim 10, said body being a substantially annular, elongated tube.

21. A method for detecting a desired field selected from the group consisting of magnetic, electric and electromagnetic fields, and discriminating undesired fields, said method comprising the steps of:
providing a detector for said desired field;
shielding said detector from said desired and undesired fields by locating a shield for said desired and undesired fields between the sources thereof and said detector; and
selectively eliminating a first portion of said shield while leaving other portions of the shield in place in order to permit entrance of said desired field through said first portion in order to permit detection of said desired field by said detector, while preventing entrance of said undesired fields through said other portions.

22. The method of claim 21, said shield comprising a multiply-connected body of superconducting material having characteristic critical temperature and critical shielding current density values, said body being disposed about said detector and operable at a temperature below the critical temperature of the material for shielding the detector from said desired and undesired fields, said eliminating step comprising the step of selectively lowering the critical shielding current density of said first portion or said body to a level permitting entrance therethrough of said desired field.

23. The method of claim 22, said critical shielding current density lowering step comprising the step of generating a localized magnetic field adjacent said first body portion different than said desired and undesired fields and of sufficient magnitude for lowering said critical shielding current density of said first portion to a level permitting entrance of said desired field.

24. The method of claim 23, including the steps of sequentially generating localized magnetic fields adjacent different portions of said body, each of said localized magnetic fields being different than said desired and undesired fields and of sufficient magnitude for lowering the critical shielding current density of the corresponding body portion to a level permitting entrance therethrough of said desired field.

25. The method of claim 23, including the steps of generating localized magnetic fields adjacent all of said body portions at levels slightly below those which would permit entry of said desired and undesired fields, and thereafter sequentially increasing the localized magnetic field of respective portions to levels permitting entrance therethrough of said desired field.

* * * * *